US012729427B2

(12) United States Patent
Kim et al.

(10) Patent No.: US 12,729,427 B2
(45) Date of Patent: Sep. 8, 2026

(54) METHOD FOR FORMING REGION-SELECTIVE THIN FILM USING SELECTIVATING AGENT

(71) Applicant: EGTM Co., Ltd., Suwon-si (KR)

(72) Inventors: Jae Min Kim, Suwon-si (KR); Ha Na Kim, Suwon-si (KR); Woong Jin Choi, Suwon-si (KR)

(73) Assignee: EGTM CO., LTD., Suwon-si (KR)

( * ) Notice: Subject to any disclaimer, the term of this patent is extended or adjusted under 35 U.S.C. 154(b) by 680 days.

(21) Appl. No.: 18/044,562

(22) PCT Filed: Jul. 8, 2021

(86) PCT No.: PCT/KR2021/008734
§ 371 (c)(1),
(2) Date: Mar. 8, 2023

(87) PCT Pub. No.: WO2022/055103
PCT Pub. Date: Mar. 17, 2022

(65) Prior Publication Data

US 2023/0366080 A1 Nov. 16, 2023

(30) Foreign Application Priority Data

Sep. 8, 2020 (KR) .......................... 1020200114669

(51) Int. Cl.
*C23C 16/04* (2006.01)
*C23C 16/40* (2006.01)
(Continued)

(52) U.S. Cl.
CPC ............ *C23C 16/04* (2013.01); *C23C 16/405* (2013.01); *C23C 16/45534* (2013.01);
(Continued)

(58) Field of Classification Search
CPC ................. H01L 21/32; H01L 21/0228; H01L 21/76224; C23C 16/04; C23C 16/042; C23C 16/45525; H10P 14/432
See application file for complete search history.

(56) References Cited

U.S. PATENT DOCUMENTS 6,165,854 A * 12/2000 Wu .................. H01L 21/76224
257/E21.546
10,468,264 B2 11/2019 Lim et al.
(Continued)

FOREIGN PATENT DOCUMENTS

KR 1020080009528 A 1/2008
KR 1020090101437 A 9/2009
(Continued)

OTHER PUBLICATIONS

Written Opinion of the International Searching Authority.

*Primary Examiner* — Tabassom Tadayyon Eslami
(74) *Attorney, Agent, or Firm* — You & IP, LLC

(57) ABSTRACT

Disclosed is a method of forming an area-selective thin film, the method comprising supplying the selectivity material to the inside of the chamber in which the substrate is placed, so that the selectivity material is adsorbed to a non-growth region of the substrate; purging the interior of the chamber; supplying a precursor to the inside of the chamber, so that the precursor is adsorbed to a growth region of the substrate; purging the interior of the chamber; and supplying a reaction material to the inside of the chamber, so that the reaction material reacts with the adsorbed precursor to form the thin film.

5 Claims, 5 Drawing Sheets

(51) Int. Cl.

| | |
|---|---|
| ***C23C 16/455*** | (2006.01) |
| ***H10P 14/60*** | (2026.01) |
| ***H10P 14/692*** | (2026.01) |

(52) U.S. Cl.

CPC ...... *H10P 14/6334* (2026.01); *H10P 14/6339* (2026.01); *H10P 14/6512* (2026.01); *H10P 14/6939* (2026.01); *H10P 14/69391* (2026.01); *H10P 14/69392* (2026.01); *H10P 14/69393* (2026.01); *H10P 14/69395* (2026.01)

(56) References Cited

U.S. PATENT DOCUMENTS

| | | | |
|---|---|---|---|
| 10,490,413 B2 | 11/2019 | Smith et al. | |
| 2008/0085610 A1 | 4/2008 | Wang et al. | |
| 2017/0037513 A1* | 2/2017 | Haukka | C23C 16/45525 |
| 2020/0048762 A1* | 2/2020 | Ke | C23C 16/0236 |
| 2020/0105515 A1* | 4/2020 | Maes | H10P 14/6339 |
| 2021/0062338 A1 | 3/2021 | Yeon et al. | |
| 2023/0058258 A1* | 2/2023 | Chandra | C23C 16/04 |

FOREIGN PATENT DOCUMENTS

| | | |
|---|---|---|
| KR | 1020180004650 A | 1/2018 |
| KR | 1020180106933 A | 10/2018 |
| KR | 10-2138149 B1 | 7/2020 |

* cited by examiner

| | Selective Material | Process Temp (°C) | Cycle | Substrate | THK(Å) | THK Decrease rate (%) |
|---|---|---|---|---|---|---|
| Comparative Example 1 | Unused | 290 | 30 | TiN | 33.07 | - |
| | | | | Si3N4 | 23.84 | - |
| Embodiment 1 | Trimethyl-orthoformate | 290 | 30 | TiN | 19.11 | 42% |
| | | | | Si3N4 | 4.3 | 82% |

FIG. 5

METHOD FOR FORMING REGION-SELECTIVE THIN FILM USING SELECTIVATING AGENT

TECHNICAL FIELD

The present invention relates to a method of formation of thin film, and more particularly, to a method of selective formation of thin film using selectivity material.

BACKGROUND ART

DRAM devices continue to be miniaturized with the development of innovative technologies, reaching the 10 nm era. Accordingly, in order to improve performance and reliability, high capacitance and low leakage current characteristics must be sufficiently maintained even if the size of the capacitor is reduced, and a breakdown voltage must be high.

Various studies are being conducted to increase the capacitance of a conventional high-k material, and there is a method of using a seed layer to help crystallize the dielectric layer.

Through this, a crystal structure having a high dielectric constant can be formed even at a relatively low temperature, but there is a problem in that a seed layer is deposited even where a dielectric film should not be deposited, resulting in leakage current.

DISCLOSURE OF THE INVENTION

Technical Problem

An object of the present invention is to provide a method for forming a thin film having a high capacitance.

Another object of the present invention is to provide a method for forming a thin film capable of minimizing leakage current.

Another object of the present invention is to provide a method for forming a thin film that has a selectivity in relation to an area.

Other objects of the present invention will become more apparent from the following detailed description.

Technical Solution

Disclosed is a method of forming an area-selective thin film, the method comprising supplying the selectivity material to the inside of the chamber in which the substrate is placed, so that the selectivity material is adsorbed to a non-growth region of the substrate; purging the interior of the chamber; supplying a precursor to the inside of the chamber, so that the precursor is adsorbed to a growth region of the substrate; purging the interior of the chamber; and supplying a reaction material to the inside of the chamber, so that the reaction material reacts with the adsorbed precursor to form the thin film.

The growth region may be a titanium nitride film or a niobium nitride film.

The non-growth region may be a silicon nitride film.

The silicon nitride film may be at least one selected from SiN, SiCN, C-doped SiN, and SiON.

The selectivity material may be represented by the following Chemical Formula 1:

<Chemical Formula 1>

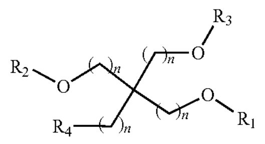

in <Chemical Formula 1>, n is each independently an integer of 0 to 8, R1 to R3 are independently selected from an alkyl group having 1 to 8 carbon atoms, R4 is selected from a hydrogen, an alkyl group having 1 to 8 carbon atoms, and an alkoxy group having 1 to 8 carbon atoms.

The reaction material may be selected from O3, O2, H2O.

The precursor may be at least one selected from Group 3 including Al, or Group 4 including Zr and Hf, or Group 5 including Nb and Ta.

The thin film may be formed by a Metal Organic Chemical Vapor Deposition (MOCVD) or an atomic layer deposition (ALD).

Advantageous Effects

According to the present invention, in a state in which the selectivity material is adsorbed to the non-growth region, the precursor is prevented from being adsorbed to the non-growth region, thereby preventing the formation of a thin film in the non-growth region. In addition, it is possible to minimize the leakage current.

DESCRIPTION OF DRAWINGS

FIG. 5 is a table showing a thickness reduction rate for an embodiment of the present invention based on Comparative Example 1.

BEST MODE

Figure 1:
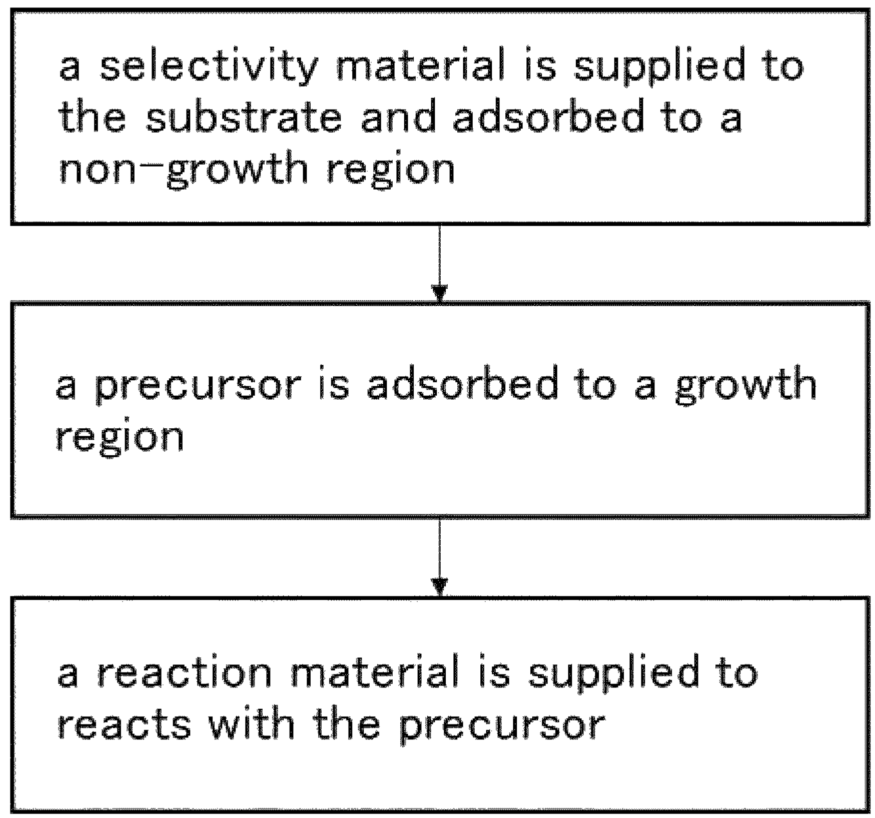
FIG. 1 is a flowchart schematically demonstrating a method of forming a thin film according to an embodiment of the present invention.

Hereinafter, embodiments of the present invention will be described using FIGS. 1 to 5. The embodiments of the present invention may include various modifications, and the scope of the present invention should not be construed to be limited to the embodiments described below. These embodiments are provided to explain the present invention in more detail to those of ordinary skill in the art to which the present invention pertains. Accordingly, the shape of each element shown in the drawings may be exaggerated to emphasize a clearer description.

Throughout this specification, when a part “includes” a certain component, it means that other components may be further included, rather than excluding other components, unless otherwise stated.

As used throughout this specification, the terms “about,” “substantially,” and the like are used in a sense at or close to the numerical value when the manufacturing and material tolerances inherent in the stated meaning are presented, and are intended to prevent unfair use of the disclosures including precise or absolute figures for the understanding of the present invention by unconscionable infringers.

Throughout this specification, the term "alkyl" or "alkyl group" refers to 1 to 12 carbon atoms, 1 to 10 carbon atoms, 1 to 8 carbon atoms, 1 to 5 carbon atoms, 1 to 3 carbon atoms, straight or branched alkyl groups having from 3 to 8 carbon atoms, or from 3 to 5 carbon atoms. For example, the alkyl group includes a methyl group, an ethyl group, an n-propyl group (nPr), an iso-propyl group (iPr), an n-butyl group (nBu), a tert-butyl group (tBu), an iso-butyl group (iBu)), sec-butyl group (sBu), n-pentyl group, tert-pentyl group, iso-pentyl group, sec-pentyl group, neopentyl group, 3-pentyl group, hexyl group, isohexyl group, heptyl group, 4,4-dimethylpentyl group, octyl group, 2,2,4-trimethylpentyl group, nonyl group, decyl group, undecyl group, dodecyl group, and isomers thereof, but may not be limited thereto.

Throughout this specification, the term "film" may include, but is not limited to, "thin film".

In the conventional process, there is a problem in that a dielectric film is deposited on a non-growth region, for example, a non-metal thin film such as a silicon nitride film, resulting in leakage current. However, the selectivity material described below is adsorbed to a non-metal thin film (eg, silicon nitride film) at a higher density than the metal thin film, and the selectivity material prevents adsorption of the metal precursor that is added later, so that a seed layer can be formed only on the metal thin film.

Figure 2:
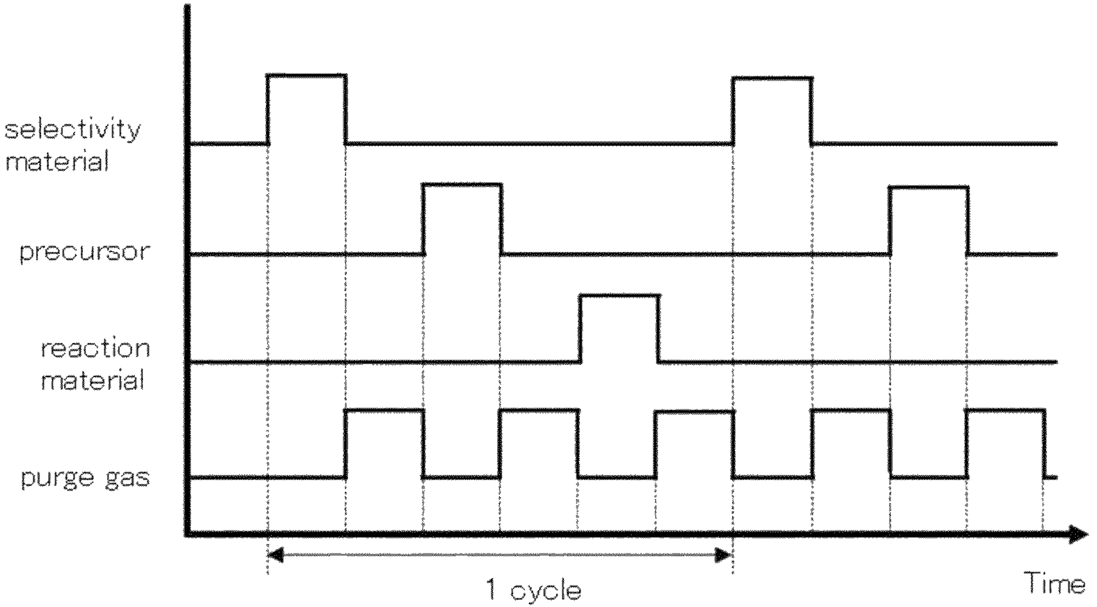
FIG. 2 is a graph schematically demonstrating a supply cycle according to FIG. 1.
Figure 3:
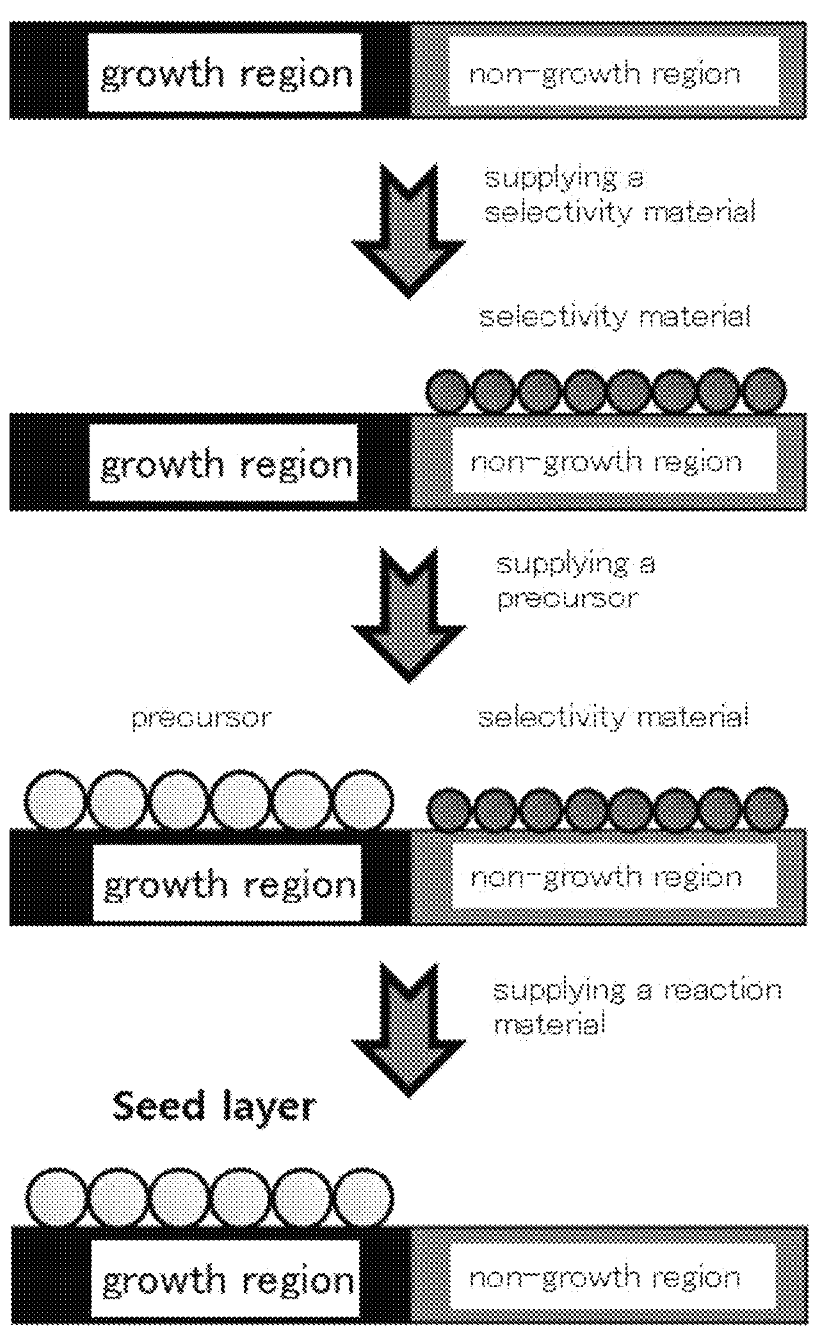
FIG. 3 is a diagram schematically illustrating a process of forming a thin film according to FIG. 1.

FIG. 1 is a flowchart schematically demonstrating a method of forming a thin film according to an embodiment of the present invention, and FIG. 2 is a graph schematically demonstrating a supply cycle according to FIG. 1. FIG. 3 is a diagram schematically illustrating a process of forming a thin film according to FIG. 1.

A substrate is loaded into a process chamber, and following ALD process conditions are adjusted. ALD process conditions may include a temperature of the substrate or process chamber, a pressure in the process chamber, gas flow rate, and the temperature is 10 to 900° C.

The substrate is exposed to the selectivity material supplied to the interior of the chamber, and the selectivity material is adsorbed to the surface of the non-growth region of the substrate. The non-growth region may be a silicon nitride layer, and may be at least one selected from SiN, SiCN, C-doped SiN, and SiON. The selectivity material is adsorbed at a high density on the surface of the non-growth region, and prevents adsorption of the metal precursor in a subsequent process.

The selectivity material may be represented by the following Chemical Formula 1:

<Chemical Formula 1>

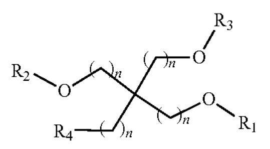

in <Chemical Formula 1>, n is each independently an integer of 0 to 8, R1 to R3 are independently selected from an alkyl group having 1 to 8 carbon atoms, R4 is selected from a hydrogen, an alkyl group having 1 to 8 carbon atoms, and an alkoxy group having 1 to 8 carbon atoms.

Thereafter, a purge gas (for example, an inert gas such as Ar) is supplied to the interior of the chamber to discharge the unadsorbed selectivity material or by-products.

Thereafter, the substrate is exposed to a metal precursor supplied to the interior of the chamber, and the metal precursor is adsorbed on the surface of growth region of the substrate and not adsorbed on the surface of non-growth region due to the selectivity material. The metal precursor may include Group 3, such as Al, or Group 4, such as Zr or Hf, or Group 5, such as Nb or Ta.

Thereafter, a purge gas (for example, an inert gas such as Ar) is supplied to the interior of the chamber to discharge the unadsorbed metal precursor or by-products.

Thereafter, the substrate is exposed to a reactant supplied to the interior of the chamber, and a thin film is formed on the surface of the substrate. The reactant reacts with the metal precursor to form the thin film, and the reactant may be selected from $O_3$, $O_2$, $H_2O$. A metal oxide layer may be formed by the reactant material. At this time, the reactant oxidizes the adsorbed surface protection material to separate and remove it from the surface of the substrate.

Thereafter, a purge gas (for example, an inert gas such as Ar) is supplied to the interior of the chamber to discharge the unreacted material or by-products.

On the other hand, it was previously described that the selectivity material is supplied before the metal precursor, the selectivity material may be supplied after the metal precursor or the metal precursor may be supplied both before and after the selectivity material.

Embodiment 1

A niobium oxide film was formed on a metal thin film (TiN) substrate and a non-metal thin film (SiN) substrate, respectively, using Trimethyl orthoformate as a selectivity material. The niobium oxide film was formed through the ALD process, the process temperature was 29000, and the reactant was ozone gas (O3).

The process of forming the niobium oxide film through the ALD process is as follows, and the following process was performed as one cycle (refer to FIGS. 1 to 3).

1) A selectivity material is supplied to the reaction chamber to be adsorbed onto the substrate.
2) Ar gas is supplied into the reaction chamber to discharge unadsorbed selectivity materials or by-products.
3) Ar is used as a carrier gas, the niobium precursor (TBTDEN, Tert-butylimido tris(diethylamido) niobium) is supplied to the reaction chamber, and the niobium precursor is adsorbed onto the substrate.
4) Ar gas is supplied into the reaction chamber to discharge unadsorbed niobium precursor or byproducts.
5) A niobium oxide film is formed by supplying ozone gas (O3) to the reaction chamber.
6) Ar gas is supplied into the reaction chamber to discharge unreacted substances or by-products.

Comparative Example 1

A niobium oxide film was formed on a metal thin film (TiN) substrate and a non-metal thin film (SiN) substrate, respectively, without using the selectivity material described above. A niobium oxide film was formed through the ALD process, the process temperature was 290° C., and the reactant was ozone gas (O3).

The process of forming the niobium oxide film through the ALD process is as follows, and the following process was performed as one cycle.

1) Ar is used as a carrier gas, the niobium precursor (TBTDEN, Tert-butylimido tris(diethylamido) niobium) is supplied to the reaction chamber, and the niobium precursor is adsorbed onto the substrate.
2) Ar gas is supplied into the reaction chamber to discharge unadsorbed niobium precursor or byproducts.
3) A niobium oxide film is formed by supplying ozone gas (O3) to the reaction chamber.
4) Ar gas is supplied into the reaction chamber to discharge unreacted substances or by-products.

Comparative Example 2

A niobium oxide film was formed in the same manner as in Embodiment 1, except that the selectivity material was changed from Trimethyl orthoformate to Ethanol.

Figure 4:
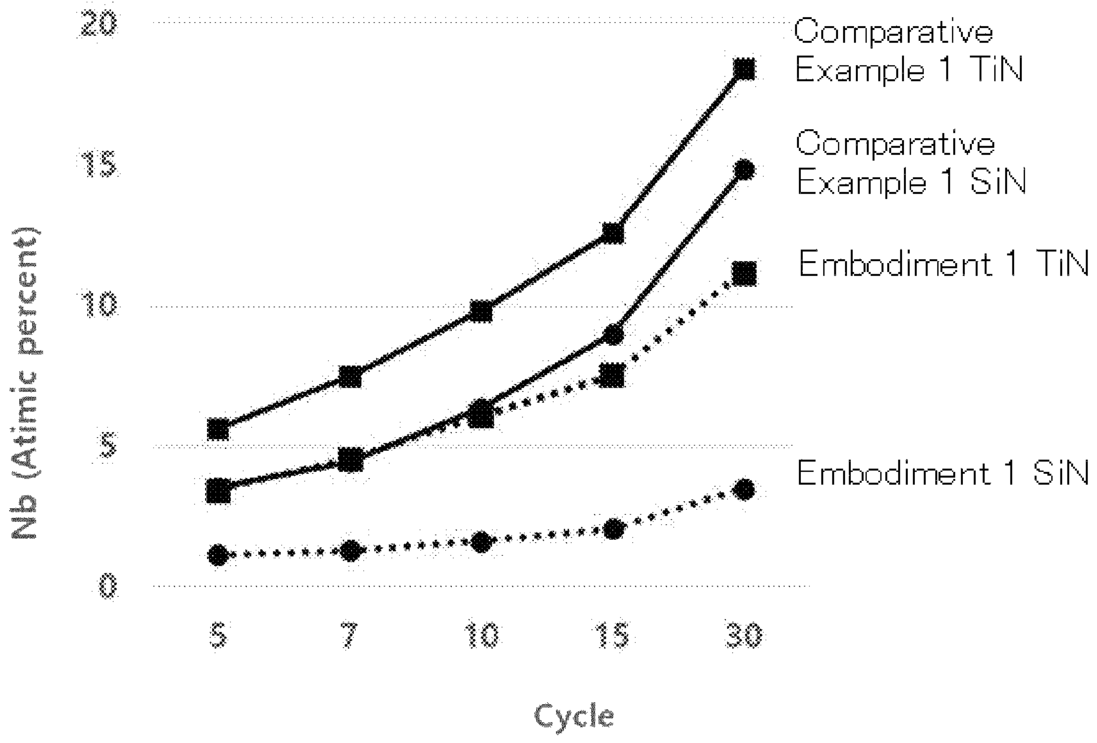
FIG. 4 is a graph demonstrating the Nb content by X-ray photoelectron spectroscopy (XPS) analysis according to an embodiment of the present invention and Comparative Example 1.

FIG. 4 is a graph demonstrating the Nb content by X-ray photoelectron spectroscopy (XPS) analysis according to an embodiment of the present invention and Comparative Example 1 (based on 30 cycles). In Comparative Example 1, the Nb content was SiN substrate:TiN substrate=1:1.2, whereas in Embodiment 1, the Nb content was SiN:TiN=1:3.2, so that the selectivity was increased. This result can be interpreted as that the selectivity material adsorbed on the SiN substrate and suppressed the deposition of the niobium precursor.

FIG. 5 is a table showing a thickness reduction rate for an embodiment of the present invention based on Comparative Example 1. As shown in FIG. 5, the thickness of the niobium oxide film of Embodiment 1 decreased by 42% on the TiN substrate, whereas the thickness decreased by 82% on the SiN substrate, confirming that the selectivity was increased. The reason why the selectivity material has selectivity in Embodiment 1 is that it is structurally compatible with the SiN substrate to enhance the adsorption force, which is interpreted as delaying the nuclear growth of the metal thin film on the SiN substrate. In addition, the desired selectivity can be obtained as a result of other complex causes.

In conclusion, the selectivity material exhibits a high thickness reduction effect through selective adsorption to the non-metal thin film, and it is possible to impart selectivity so that the dielectric film is deposited on a desired area of the substrate, as well as to prevent the formation of a thin film in an unnecessary area. Therefore, leakage current can be minimized.

The present invention has been explained in detail with reference to embodiments, but other embodiments may be included. Accordingly, the technical idea and scope described in the claims below are not limited to the embodiments.

INDUSTRIAL APPLICABILITY

The present invention may be applicable to a various method for manufacturing semiconductor.

The invention claimed is:

1. A method of forming an area-selective thin film, the method comprising:

preparing a substrate in a chamber, the substrate including a growth region and a non-growth region, wherein the growth region is a titanium nitride film or a niobium nitride film, and the non-growth region is a silicon nitride film;

supplying a selectivity material into the chamber in which the substrate is placed, wherein the selectivity material is trimethyl orthoformate and configured to be adsorbed to the non-growth region of the substrate;

purging the interior of the chamber;

supplying a niobium precursor into the chamber, wherein the niobium precursor is configured to be adsorbed to the growth region of the substrate;

purging the interior of the chamber; and supplying a reaction material into the chamber to form the area-selective thin film, wherein the area-selective thin film is a niobium oxide film, and the niobium oxide film formed on the growth region of the substrate has a thickness that is greater than a thickness of the niobium oxide film formed on the non-growth region of the substrate, thereby improving a selectivity between the growth region and the non-growth region.

2. The method of claim 1, wherein the silicon nitride film is at least one selected from SiN, SiCN, C-doped SiN, and SiON.

3. The method of claim 1, wherein the reaction material is selected from $O_3$, $O_2$, $H_2O$.

4. The method of claim 1, wherein the area-selective thin film is formed by a Metal Organic Chemical Vapor Deposition (MOCVD) or an atomic layer deposition (ALD).

5. The method of claim 1, wherein the niobium precursor is Tert-butylimido tris(diethylamido) niobium (TBTDEN).

* * * * *